United States Patent
Moors et al.

(10) Patent No.: US 7,935,218 B2
(45) Date of Patent: May 3, 2011

(54) OPTICAL APPARATUS, LITHOGRAPHIC APPARATUS AND DEVICE MANUFACTURING METHOD

(75) Inventors: Johannes Hubertus Josephina Moors, Helmond (NL); Vadim Yevgenyevich Banine, Helmond (NL); Bastiaan Theodoor Wolschrijn, Abcoude (NL); Carolus Ida Maria Antonius Spee, Helmond (NL); Rik Jansen, Haarlen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/643,955

(22) Filed: Dec. 22, 2006

(65) Prior Publication Data
US 2007/0158579 A1   Jul. 12, 2007

Related U.S. Application Data

(60) Provisional application No. 60/753,423, filed on Dec. 27, 2005.

(51) Int. Cl.
*C23F 1/00* (2006.01)
(52) U.S. Cl. ......... 156/345.4; 156/345.5; 430/5; 216/60
(58) Field of Classification Search ............... 156/345.4, 156/44, 51, 52, 41, 42, 345, 4, 43, 5; 430/5, 430/30, 311, 302; 216/60
See application file for complete search history.

(56) References Cited

U.S. PATENT DOCUMENTS

| | | | | |
|---|---|---|---|---|
| 5,981,001 A | * | 11/1999 | Komatsu et al. | 427/582 |
| 5,991,360 A | * | 11/1999 | Matsui et al. | 378/119 |
| 6,533,952 B2 | | 3/2003 | Klebanoff et al. | 216/67 |
| 2003/0186134 A1 | * | 10/2003 | Hill | 430/5 |
| 2004/0137733 A1 | * | 7/2004 | Hautala | 438/689 |
| 2005/0122492 A1 | * | 6/2005 | Hase | 355/30 |

FOREIGN PATENT DOCUMENTS

WO   WO 02/05347 A2   1/2002
WO   WO 02/05347 A3   1/2002

* cited by examiner

*Primary Examiner* — Lan Vinh
(74) *Attorney, Agent, or Firm* — Pillsbury Winthrop Shaw Pittman LLP

(57) ABSTRACT

An optical apparatus includes an illumination system configured to form a pulsed radiation beam, an optical element with a surface on which the radiation beam is incident in operation, and a gas source arranged to supply a mixture of a first type of gas and a second type of gas to a space adjacent the surface. Particles of the first and second types of gas are capable of reacting with the surface, when activated by the radiation beam. The gas source is configured to generate a combination of surface occupation numbers of molecules of the first and second types of gas on the surface under operating conditions, at least prior to pulses of the radiation beam, the combination of surface occupation numbers lying in a range in which reactions of particles with the surface during pulses of the radiation beam are in majority reversed.

16 Claims, 3 Drawing Sheets

OPTICAL APPARATUS, LITHOGRAPHIC APPARATUS AND DEVICE MANUFACTURING METHOD

CROSS-REFERENCE TO RELATED APPLICATIONS

This application claims the benefit or priority from U.S. Provisional Patent Application No. 60/753,423, which was filed on Dec. 27, 2005 and is currently pending, the content of which being hereby incorporated by reference in its entirety.

FIELD

The present invention relates to an optical apparatus for short wavelength radiation, such as (E)UV radiation, a lithographic apparatus and a method of manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The size of structural details of devices that are manufactured with lithographic apparatus is continually decreasing. Accordingly, there has been a desire to use light (more generally radiation) of increasingly shorter wavelength into the UV and EUV range. Synchrotrons have been proposed as light sources, for example. Optical apparatus that use radiation of such short wavelengths typically use reflective mirrors instead of (refractive) lenses. Unfortunately, it has been found that these mirrors tend to degrade due to reactions at their surface, with chemicals that are induced by the radiation. Radiation of short wavelengths gives rise to a photoelectric effect, whereby electrons are liberated from the mirrors. These electrons, in turn, chemically activate gas molecules, like oxygen or water molecules, at or near the mirror surface and the activated molecules react with the surface.

In U.S. Pat. No. 6,533,952 a process called "mitigation" has been proposed to solve this problem. Similar techniques are described in WO 02/05347. "Mitigation" as used herein is the limitation of degradation of optical surfaces by the introduction of gases. Basically, when mitigation is used, gas molecules that would give rise to the contamination problem are added such that their effects balance.

A hydrocarbon is known to grow carbon on a mirror when illuminated with EUV, while for example oxygen is known to oxidize the top layer during exposure. A mixture of molecules of a first type (e.g hydrocarbons) and second type (e.g. $H_2O$ or $O_2$) is introduced in the space near the surface of the mirror. The ratio between molecules of the first and second type in the mixture is selected such that permanent effects on the mirror are largely prevented. The pressure of the gases added to the lithography tool to this purpose is selected much higher than that of background gas molecules that are present, so that these cannot significantly affect the reaction balance.

This mitigation method works well when a pseudo-continuous EUV source like a synchroton is used. However, a synchroton is very costly and large. It would be preferred to use less expensive radiation sources like plasma sources. However, in contrast to a synchroton these are pulsed sources with a very low duty cycle. It has been found that the introduction of gases as such does not lead to mitigation when such a pulsed radiation source with a low duty cycle is used. On the contrary, introduction of a mitigation mixture even appears to increase degradation of the optical surfaces.

SUMMARY

It is desirable to provide for a form of mitigation that works when a pulsed radiation source is used.

According to an aspect of the invention, there is provided an optical apparatus. The optical apparatus includes an illumination system configured to form a pulsed radiation beam, an optical element with a surface on which the radiation beam is incident in operation, and a gas source arranged to supply a mixture of a first type of gas and a second type of gas to a space adjacent the surface. Particles of the first and second types of gas are capable of reacting with the surface, when activated by the radiation beam, and with particles of the second and first types of gas, respectively, which have reacted with the surface. The gas source is configured to generate a combination of surface occupation numbers of molecules of the first and second types of gas on the surface under operating conditions, at least prior to pulses of the radiation beam, the combination of surface occupation numbers lying in a range in which reactions of particles with the surface during pulses of the radiation beam are in majority reversed, at least as long as the combination of surface occupation numbers is not changed due to radiation in a pulse of the radiation beam. As used herein, "particles" include molecules, ionized molecules, atoms and ionized atoms.

According to another aspect of the invention there is provided a lithographic apparatus. The lithographic apparatus includes an illumination system configured to condition a pulsed radiation beam, and a support constructed to support a patterning device. The patterning device is configured to impart the radiation beam with a pattern in its cross-section to form a patterned radiation beam. The apparatus also includes a substrate table constructed to hold a substrate, a projection system configured to project the patterned radiation beam onto a target portion of the substrate, and an optical element in the illumination system or the projection system. The optical element has a surface on which the radiation beam is incident. The apparatus further includes a gas source, arranged to supply a mixture of a first type of gas and a second type of gas to a space adjacent the surface. Particles of the first and second types of gas are capable of reacting with the surface when activated by the radiation beam, and with particles of the second and first type of gas, respectively, which have reacted with the surface. The gas source is configured to generate a combination of surface occupation numbers of the molecules of the first and second types of gas on the surface under operating conditions, at least prior to pulses of the radiation beam, the combination of surface occupation numbers lying in a range in which reactions of particles with the surface during pulses of the radiation beam are in majority reversed, at least as long as the combination of surface occupation numbers is not changed due to radiation in a pulse of the radiation beam.

According to another aspect of the invention there is provided a method of optically processing a beam of radiation. The method includes generating a pulsed beam of radiation, directing the pulsed beam onto a surface, and supplying a mixture of a first type of gas and a second type of gas to a space adjacent the surface. Particles of the first and second types of gas are capable of reacting with the surface, when activated by the radiation beam, and with particles of the second and first types of gas, respectively, which have reacted with the surface. The method also includes generating a combination of surface occupation numbers of the molecules of the first and second types of gas on the surface at starting times of pulses of the radiation beam, the combination of surface occupation numbers lying in a range in which reactions of particles with the surface during pulses of the radiation beam are in majority reversed, at least as long as the combination of surface occupation numbers is not changed due to radiation in a pulse of the radiation beam.

According to another aspect of the invention there is provided a device manufacturing method. The device manufacturing method includes generating a pulsed radiation beam, patterning the radiation beam with a patterning device, projecting the beam from the patterning device to a substrate, and supplying a mixture of a first type of gas and a second type of gas to a space adjacent a surface on which the beam is incident. Particles of the first and second types of gas are capable of reacting with the surface, when activated by the radiation beam, and with particles of the second and first types of gas, respectively, which have reacted with the surface. The method also includes generating a combination of surface occupation numbers of the molecules of the first and second types of gas on the surface at starting times of pulses of the radiation beam, the combination of surface occupation numbers lying in a range in which reactions of particles with the surface during pulses of the radiation beam are in majority reversed at least as long as the combination of surface occupation numbers is not changed due to radiation in a pulse of the radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
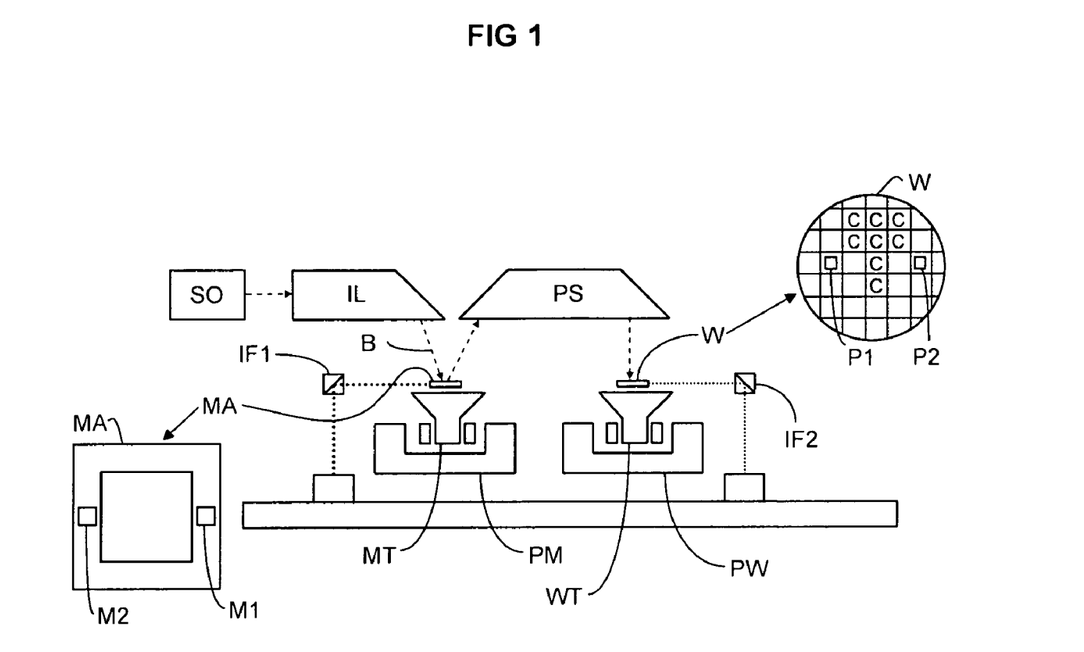
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if needed, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an embodiment of the invention, the radiation source SO is a pulsed radiation source, for example a plasma source. In a typical example, a pulsed radiation source produces a pulse of 100 nanoseconds every 0.1 millisecond. Such pulsed radiation sources can be realized at much lower cost, with a much more compact size than a quasi-continuous source such as a synchrotron.

Figure 2:
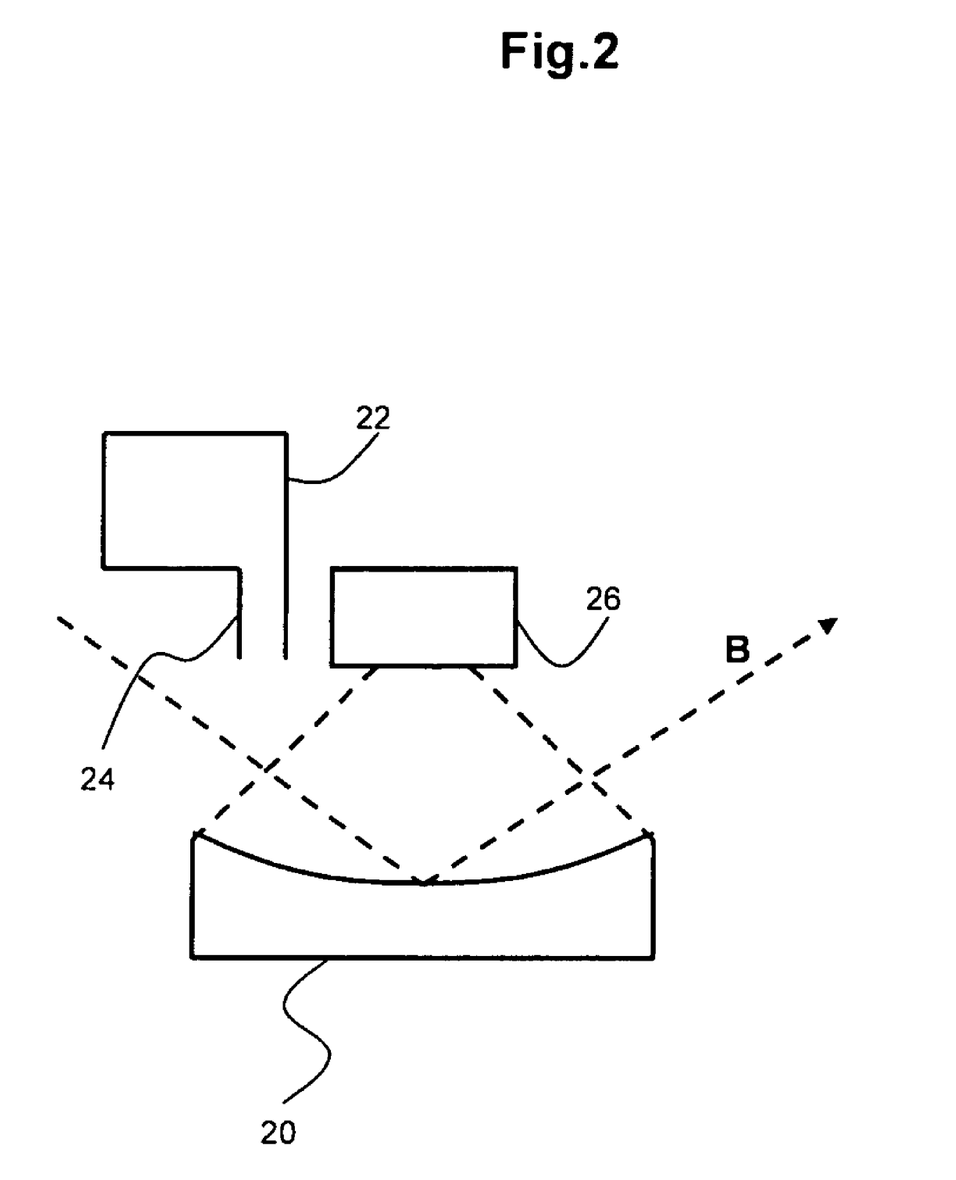
FIG. 2 shows a mirror configuration.

FIG. 2 schematically illustrates a mirror configuration in illuminator IL or projection system PS. The mirror configuration comprises a mirror 20, which acts as an optical element in the path of radiation beam B, a gas mixture source 22 with an outlet 24 near the surface of mirror 20, and an auxiliary radiation source 26 directed at mirror 20. Auxiliary radiation source 26 may comprise, for example, a DUV lamp. Auxiliary radiation source 26 is located so that it will not intercept radiation beam B, and mirror 20 will not reflect radiation from auxiliary radiation source 26 into the path of radiation beam B.

In operation, radiation source SO produces a pulsed radiation beam and auxiliary radiation source 26 illuminates mirror 20 at least temporally outside pulses of radiation beam B.

Gas mixture source 22 and outlet 24 serve to supply a mixture of gases to the space near the surface of mirror 20 that reflects beam B. It will be understood that gas mixture source 22 and outlet 24 are shown only symbolically in FIG. 2. In practice, various configurations may be used, either for supplying gases mixed or separately, from one or more outlets directed at and/or near the surface of mirror 20, or for creating an atmosphere throughout a cabinet (not shown) wherein mirror 20 is located. Gas mixtures and pressures may be used and supplied using a gas supply arrangement as has been used in the prior art when a continuous beam source was used. For example, MMA (MMA=methyl methacrylate) may be supplied at a partial pressure of $10^{-7}$ mbar and oxygen at a pressure of $5 \times 10^{-4}$ mbar.

Radiation from auxiliary radiation source 26 serves to affect the concentration ratio of activated absorbed species at the surface of mirror 20, at least prior to pulses of radiation beam B. Experiments have shown that it can be achieved that no measurable degradation occurs after more than two hundred hours of irradiation with radiation beam B (i.e. less than 0.2% degradation of reflectivity), under circumstances where without mitigation gases more than 1% decrease of reflectivity would have occurred after such a time period. The following theory is proposed for this effect, but it should be appreciated that this is only a theory, which serves to understand the effect, although this understanding is not necessary to implement mitigation.

When present, radiation beam B liberates electrons from mirror 20. These electrons activate absorbed gas molecules on the surface of the optical element (e.g. by ionizing them and/or by causing them to dissociate). Thus, radiation beam B indirectly actives the gas molecules. The activated molecules are of two types (which will be called I and II), derived from MMA and oxygen, respectively, for example. Activated molecules of the different types react in different ways with a mirror surface. The molecules of type I lead to carbon growth on the mirror, while the molecules of type II lead to oxidation of the mirror. Initially, reactions with the surface of mirror 20 are reversible, in the sense that if a type II molecule has reacted with the mirror surface, which leads to oxidation of the mirror surface, it can still react with a type I molecule, whereby the type II molecule is detached from the surface (thus the oxidized surface is returned to the original surface composition). However, when reactions with the surface of mirror 20 continue for a prolonged period without being reversed, the molecules may become attached to increasingly deeper layers of mirror 20 (volume oxidation), from which they cannot be removed by reacting with molecules of the other type.

Figure 3:
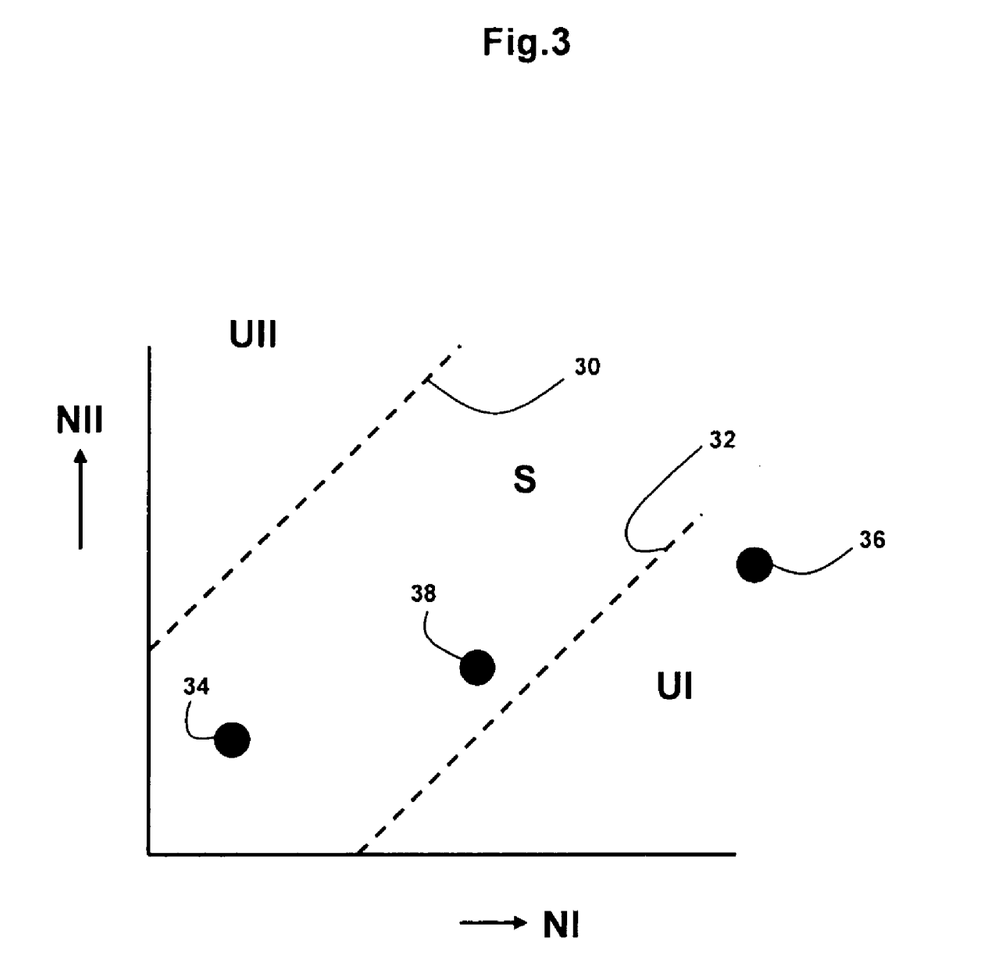
FIG. 3 shows a diagram of surface occupation numbers of a mirror.

FIG. 3 shows a state diagram of combinations of surface occupations (NI, NII, plotted logarithmically) at a unit area of the surface of mirror 20, where NI is an occupation of molecules of the first type (e.g. a hydrocarbon like MMA) and NII is an occupation of molecules of the second type (e.g. oxygen or water). Each point in the state diagram corresponds to a possible combination of occupations on the surface of mirror 20. Boundary lines 30, 32 indicate the boundaries of a region S of "safe" combinations of occupations wherein no irreversible attachment to mirror 20 occurs if the molecules are activated, or at least a majority (>50% and preferably >90% or >99%) of the molecules that have reacted with mirror 20 are removed by reaction with other molecules. Outside these boundaries 30, 32 the state diagram has "unsafe" regions UI and UII. In unsafe region UI, the mirror may grow carbon, which may lead to reflection loss, in a way that is not reversed by reaction with the other type of molecules. In unsafe region UII, the mirror may become oxidized in a way that is not reversed by reaction with the other type of molecules. Point 34 indicates a "safe" combination of occupations. With continuous or quasi continuous illumination, as described in prior art, the surface occupations can be reached by adapting the pressures of the gases and thus the fluxes of gases towards the surface. For pulsed irradiation, this is not similar because there will be an equilibrium between adsorption and desorption of species at the surface. As used herein, "(quasi-)continuous radiation" is a form of continuous radiation, or a form of pulsed radiation having pulses with a pulse duration and lengths between pulses so that a stationary state of the occupation numbers is substantially reached during a pulse, and the stationary state substantially persists until the start of the next pulse, or with a pulse duration wherein the stationary state reached under influence of the pulse substantially occurs over most of the pulse duration. The pulsed radiation source used in the present invention is of a type that does not produce such (quasi-) continuous radiation.

The dynamics of the surface occupations can be modeled with the following equations:

$$dNI/dt = \text{adsorption}(pI, NI) - \text{desorption}(NI) - \text{reaction1}(NI, NII) \quad (1)$$

$$dNII/dt = \text{adsorption}(pII, NII) - \text{desorption}(NII) - \text{reaction2}(NI, NII) \quad (2)$$

The terms "reaction1" and "reaction2" are the rates of reactions by which molecules of the first and second type are removed, typically by reacting to the surface or by reacting with the other type of molecule when that is bound to the surface. The reaction rates typically depend on at least one of the occupation numbers NI, NII, the status of the surface, and illumination intensity. The rate of adsorption typically depends on the partial pressure pI, pII of the gas that gives rise to flux of the molecules on the surface of mirror 20 and the occupation numbers NI, NII. Typically, adsorption is proportional to partial pressure and the fraction of the surface that is not occupied (1-NI -NII). Desorption of molecules from mirror 20 is found to depend on the occupation. Typically, desorption is proportional to occupation. The saturation value of the occupation and the constants of proportionality for adsorption and desorption are generally different for different types of gas.

The reaction rates depend on the concentration of molecules of the different types and illumination intensity. If there is a continuous beam with high intensity, a stationary state develops ($dNI/dt=0$ and $dNII/dt=0$), wherein the reaction rate substantially equals the adsorption rate. Desorption can be neglected in this case. Under these circumstances, the occupations follow from $$0 = \text{adsorption}(pI, NI) - \text{reaction1}(NI, NII) \quad (3)$$

$$0 = \text{adsorption}(pII, NII) - \text{reaction2}(NI, NII) \quad (4)$$

The point 34 in FIG. 3 is an example of a combination of occupations that is a solution of these equations.

When there is no radiation intensity, little or no molecules are activated and there is no reaction. In this case a stationary combination of occupations NI, NII develops wherein adsorption equals desorption:

$$0 = \text{adsorption}(pI, NI) - \text{desorption}(NI) \quad (5)$$

$$0 = \text{adsorption}(pII, NII) - \text{desorption}(NII). \quad (6)$$

At sufficiently high partial pressure, this leads to saturation of the occupation, wherein the adsorption term equals the rate of desorption and the occupation numbers NI, NII approach saturation values. The difference between effects at no radiation or pulsed radiation and continuous radiation are largest for species that are volatile (high desorption rate) and therefore have a saturated surface occupation that is small. The saturation values thus depend significantly on the character of the gas species. For example, the saturation value for MMA is much higher than that for oxygen at comparable pressures. The result is that the ratio of saturated occupations is completely different from the ratio of the corresponding pressures. Thus, practical pressures cannot help to avoid that the ratio of saturated occupations will generally be outside the safe region S of the state diagram (in the unsafe region UII at a point 36, for example).

In theory, this could be avoided by using a very high partial oxygen gas pressure near the mirror, to achieve a substantial oxygen surface saturation and thereby a balance with the MMA effect at moderate MMA pressures. However, it has been found that the needed oxygen occupation could be realized only with impracticably high partial oxygen pressures. That is, it is practically impossible to provide a state in safe region S when there is no radiation. This also holds for other oxygen supplying gases such as water vapor. Another possibility in this case could be, in theory, to decrease the MMA pressure to again achieve a balance with the oxygen effect. But in this case, the pressure of MMA will be so small that the surface occupations are very small and all effects will be dominated by the background gas.

Normally, there is not a problem because without radiation, there are also no reactions and if a continuous beam is used, the state of occupation quickly moves from unsafe point 36 to safe point 34, lowering the MMA and oxygen surface occupations well below its saturation value. However, if a pulsed beam source is used with pulses that are shorter than the time needed to reach safe point 34, or not significantly longer, much of the radiation of the beam will affect reactions while the state is in unsafe region UII. This may lead to deterioration of the mirror. Typical times between pulses are 0.1-1 ms, while the time to reach steady state surface occupation is in the micro-second range for volatile hydrocarbons like MMA and even smaller for oxygen, for example.

However, by supplying auxiliary radiation during the period outside the beam pulses, and preferably continuously, a stationary state of occupations 38 can be generated or realized in safe region S, even with practically controllable oxygen (or water vapor) pressures.

Auxiliary radiation source 26 is used to provide adapted occupations at the start of each pulse of radiation beam B. Auxiliary radiation creates a stationary state on the surface of mirror 20 outside pulses of radiation beam B. The auxiliary radiation activates molecules, causing a certain amount of reactions, so that the stationary state follows from $$0 = \text{adsorption}(pI, NI) - \text{desorption}(NI) - \text{reaction1}(NI, NII) \quad (7)$$

$$0 = \text{adsorption}(pII, NII) - \text{desorption}(NII) - \text{reaction2}(NI, NII) \quad (8)$$

The occupations NI and NII that are the solution of these equations are lower than the occupations without radiation, because the reactions act to remove molecules at a higher rate. Preferably, the intensity and wavelength of the auxiliary radiation are sufficient to prevent saturation at the surface (e.g. by lowering occupation at least to less than half the saturation value), so that the difference in saturation value between the two gases is no longer determinative for the overall contamination rates of the mirror surface.

It should be noted that auxiliary radiation source 26 need not produce the same size of effect on the occupations as radiation beam B would, if beam B were continuous. Therefore, the auxiliary radiation source 26 need not produce radiation of the same wavelength or the same intensity as the beam source. It suffices that the dynamic equilibrium state is reached that is anywhere in safe region S. It has been found that the intensity of auxiliary radiation source 26 can be taken anywhere within a wide range of values without significantly affecting the efficacy of suppression of deterioration.

Hence, the auxiliary radiation source 26 may be of a type that produces a relatively low intensity radiation, compared with projection beam B. This has the advantage that much lower demands should be able to be placed on auxiliary radiation source 26 than on the source of beam B. Also, the radiation from auxiliary radiation source 26 need not have the same wavelength as radiation beam B; a higher wavelength may be used, for example, which can be produced more easily than that of projection beam B. Of course, the wavelength should be short enough that molecules are activated, and the intensity should exceed a minimum value above which sufficient mitigation is active. Both can be determined by testing, first with decreasing wavelengths to observe when activation occurs and then, for example, with decreasing intensity to observe when degradation starts to arise. For example, the activation of these species with 248 nm light has been proven.

Preferably, a continuous auxiliary radiation source 26 is used, i.e., a source that continuously supplies radiation between pulses of beam B. Preferably, the intensity of auxiliary radiation source 26 is constant in time. However, it should be noted that this is not necessary. Variations in the intensity of auxiliary radiation source 26 may be tolerated. It may even be contemplated to use a gradual build up of radiation from auxiliary radiation source 26 prior to each pulse of beam B, so that the occupation state starts from outside safe region S and moves into safe region S before each pulse, provided that the intensity of the auxiliary radiation is changed gradually, maintaining low intensity while the occupation state moves towards safe region S, so that a minimum number of undesirable reactions occur.

Instead of an electromagnetic (light) radiation source, an electron source may be used to supply electrons to the surface to activate the gases. As used herein, such an electron source is also referred to as a radiation source. Although an embodiment has been applied wherein the additional radiation is supplied to the surface of a mirror 20, it should be understood that alternatively, or in addition, the radiation may be supplied to other surfaces in the path of beam B, for example, to the surface of a reticle, which contains a pattern that is imaged onto the wafer, or the surface of a sensor that is used to monitor the beam.

In one embodiment, wherein the lithographic apparatus has a plurality of mirrors in the path of radiation beam B, a plurality of auxiliary radiation sources may be provided, each directed to provide auxiliary radiation on a respective one of the mirrors. In another embodiment, an auxiliary radiation source may be provided that directs auxiliary radiation to a plurality of the mirrors. Since no high intensity, or carefully shaped and focused radiation is needed, this should not place high demands on the auxiliary radiation source.

Replacement of oxygen by a gas species which has a lower desorption rate is another measure that can be used to generate or realize occupation states in safe region S. Preferably, a gas species is used which has a higher activation energy than oxygen for desorption. Examples of this suitable type of gas are water and heavier molecules that contain oxidizing groups. When $H_2O$ is supplied with a partial pressure of 1E-3 mbar, for example, the theory predicts that a state in safe region S may be realized with a partial MMA pressure of 1E-7 mbar. For an oxidizing agent with a higher surface occupation, the MMA pressure may be allowed to be higher, or a hydrocarbon with a lower vapor pressure might even be used.

Such a gas species can be used in addition to, or instead of, using auxiliary radiation source 26. With a combination of water vapor and MMA, for example, the partial pressures for realizing a state in safe region S can easily be generated or realized prior to pulses of the beam without auxiliary radiation. In this case, no auxiliary radiation is needed. At other pressures, or when other gas species are used, auxiliary radiation may still be useful.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:
1. An optical apparatus, comprising:
   an illumination system configured to form a pulsed radiation beam;
   an auxiliary radiation source configured to generate an auxiliary radiation beam, wherein the auxiliary radiation source is arranged with respect to the illumination system so that the auxiliary radiation source does not intercept the pulsed radiation beam;
   an optical element with a surface on which the pulsed radiation beam and the auxiliary radiation beam are incident in operation; and
   a gas source arranged and configured to supply a mixture of a first type of gas and a second type of gas to a space adjacent the surface, particles of the first and second types of gas arranged to react with the surface, when activated by the pulsed radiation beam, and with particles of the second and first types of gas, respectively, which have reacted with the surface,
   the gas source being configured to generate a combination of surface occupation numbers of molecules of the first and second types of gas on the surface under operating conditions, at least prior to pulses of the pulsed radiation beam, the combination of surface occupation numbers lying in a range in which reactions of particles with the surface during pulses of the pulsed radiation beam are in majority reversed, at least as long as the combination of surface occupation numbers is not changed due to radiation in a pulse of the pulsed radiation beam.

2. An optical apparatus according to claim 1, wherein the auxiliary radiation source and the optical element are arranged such that the auxiliary radiation beam does not reflect off of the optical element into the path of the pulsed radiation beam.

3. An optical apparatus according to claim 1, wherein the first and second types of gas are a carbonizing gas and an oxidizing gas, respectively.

4. An optical apparatus according to claim 3, wherein the first and second types of gas are methyl methacrylate and oxygen, respectively.

5. An optical apparatus according to claim 1, wherein the first and second types of gas are selected so that in an equilibrium state prior to a pulse of the pulsed radiation beam a ratio of particles of the first and second type of gas that are adsorbed to the surface is in a range in which reactions of particles with the surface during the pulse are in majority reversed.

6. An optical apparatus according to claim 5, wherein the first and second types of gas are a hydrocarbon and water vapor, respectively.

7. An optical apparatus according to claim 6 wherein said hydrocarbon is methyl methacrylate.

8. An optical apparatus according to claim 1, wherein the auxiliary, radiation source is arranged to irradiate the surface so that the particles at the surface are activated, at least prior to respective pulses of the pulsed radiation beam, to an extent that said combination is changed to a combination in the range in which reactions of particles with the surface during pulses of the pulsed radiation beam are in majority reversed.

9. An optical apparatus according to claim 8, wherein the auxiliary radiation source is arranged to provide radiation continuously between pairs of successive pulses of the pulsed radiation beam.

10. An optical apparatus according to claim 8, wherein the auxiliary radiation source is arranged to provide radiation of a same type as the pulsed radiation beam, but with a radiation intensity at the surface that is less than an intensity of the pulsed radiation beam at the surface.

11. An optical apparatus according to claim 8, wherein the auxiliary radiation source is arranged to provide radiation of a same type as the pulsed radiation beam, the auxiliary radiation source having a main emission band at wavelengths above wavelengths of a main emission band of the pulsed radiation beam.

12. An optical apparatus according to claim 8, wherein the auxiliary radiation source comprises an electron beam source, the auxiliary radiation source activating the particles with emitted electrons.

13. A lithographic apparatus comprising:
an illumination system configured to condition a pulsed radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate,
an auxiliary radiation source configured to generate an auxiliary radiation beam, wherein the auxiliary radiation source is arranged with respect to the illumination system so that the auxiliary radiation source does not intercept the pulsed radiation beam;
an optical element in the illumination system or the projection system, the optical element having a surface on which the pulsed radiation beam and the auxiliary radiation beam are incident; and
a gas source, arranged and configured to supply a mixture of a first type of gas and a second type of gas to a space adjacent the surface, particles of the first and second types of gas arranged to react with the surface when activated by the pulsed radiation beam, and with particles of the second and first type of gas, respectively, which have reacted with the surface,
the gas source being configured to generate a combination of surface occupation numbers of the molecules of the first and second types of gas on the surface under operating conditions, at least prior to pulses of the pulsed radiation beam, the combination of surface occupation numbers lying in a range in which reactions of particles with the surface during pulses of the pulsed radiation beam are in majority reversed, at least as long as the combination of surface occupation numbers is not changed due to radiation in a pulse of the pulsed radiation beam.

14. A lithographic apparatus according to claim 13, wherein the auxiliary radiation source is arranged to irradiate the surface so that the particles at the surface are activated, at least prior to respective pulses of the pulsed radiation beam.

15. A lithographic apparatus according to claim 13, wherein the first and second types of gas are selected so that in an equilibrium state prior to a pulse of the pulsed radiation beam, a ratio of particles of the first and second types of gas that are adsorbed to the surface is in a range in which reactions of particles with the surface during the pulse of the pulsed radiation beam are in majority reversed.

16. A lithographic apparatus according to claim 13, wherein the auxiliary radiation source and the optical element are arranged such that the auxiliary radiation beam does not reflect off of the optical element into the path of the pulsed radiation beam.

\* \* \* \* \*